(12) United States Patent
Kim et al.

(10) Patent No.: US 12,130,510 B2
(45) Date of Patent: Oct. 29, 2024

(54) DISPLAY APPARATUS AND MANUFACTURING METHOD THEREOF

(71) Applicant: SAMSUNG ELECTRONICS CO., LTD., Suwon-si (KR)

(72) Inventors: Enjung Kim, Suwon-si (KR); Jeongphil Seo, Suwon-si (KR); Sungho Kim, Suwon-si (KR); Seungjun Jeong, Suwon-si (KR); Suhong Ko, Suwon-si (KR); Bupmyoung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/136,514

(22) Filed: Apr. 19, 2023

(65) Prior Publication Data

US 2023/0296933 A1 Sep. 21, 2023

Related U.S. Application Data

(63) Continuation of application No. PCT/KR2021/013500, filed on Oct. 1, 2021.

(30) Foreign Application Priority Data

Oct. 27, 2020 (KR) ........................ 10-2020-0140688

(51) Int. Cl.
*G02F 1/1333* (2006.01)
*G02F 1/1345* (2006.01)
(Continued)

(52) U.S. Cl.
CPC .... *G02F 1/133308* (2013.01); *G02F 1/13452* (2013.01); *G02F 1/13456* (2021.01);
(Continued)

(58) Field of Classification Search
CPC ........... G02F 1/133308; G02F 1/13452; G02F 1/13456; G02F 1/136286; G02F 1/1368;
(Continued)

(56) References Cited

U.S. PATENT DOCUMENTS 8,183,755 B2 5/2012 Bang et al.
9,958,718 B2 5/2018 Shin et al.
(Continued)

FOREIGN PATENT DOCUMENTS

CN 110764323 A 2/2020
KR 10-2009-0129312 A 12/2009
(Continued)

OTHER PUBLICATIONS

International Search Report (PCT/ISA/210) issued by the International Searching Authority on Jan. 18, 2022 in corresponding International Application No. PCT/KR2021/013500.
(Continued)

*Primary Examiner* — Amit Chatly
(74) *Attorney, Agent, or Firm* — Sughrue Mion, PLLC

(57) ABSTRACT

A display apparatus includes a first substrate including an upper end, a left end, a right end, and a lower end, and a plurality of wiring pads extending to the lower end; a display layer provided on a surface of the first substrate; a second substrate provided on a surface of the display layer, including an upper end, a left end, and a right end coincident with the upper end, the left end, and the right end of the first substrate, and a lower end shorter than the lower end of the first substrate, where the plurality of wiring pads of the first substrate are exposed; a plurality of side wiring pads provided on the lower end of the first substrate and the lower end of the second substrate and connected to the plurality of wiring pads; and a display driving circuit connected to the plurality of side wiring pads.

20 Claims, 22 Drawing Sheets

(51) Int. Cl.
*G02F 1/1362* (2006.01)
*G02F 1/1368* (2006.01)
*G03F 7/00* (2006.01)
*G09G 3/3208* (2016.01)
*G09G 3/36* (2006.01)
*H01L 27/12* (2006.01)

(52) U.S. Cl.
CPC ...... *G02F 1/136286* (2013.01); *G02F 1/1368* (2013.01); *G03F 7/0005* (2013.01); *G09G 3/3208* (2013.01); *G09G 3/36* (2013.01); *H01L 27/124* (2013.01); *H01L 27/1259* (2013.01); *G09G 2310/0264* (2013.01)

(58) Field of Classification Search
CPC ........... G02F 1/13458; G02F 1/136227; G02F 1/136295; G03F 7/0005; G09G 3/3208; G09G 3/36; G09G 2310/0264; H01L 27/124; H01L 27/1259
See application file for complete search history.

(56) References Cited

U.S. PATENT DOCUMENTS

| | | | |
|---|---|---|---|
| 9,983,447 | B2 | 5/2018 | Shin et al. |
| 10,459,269 | B2 | 10/2019 | Shin et al. |
| 11,056,630 | B2 | 7/2021 | Hong et al. |
| 11,409,335 | B2 | 8/2022 | Jeong |
| 11,480,819 | B2 | 10/2022 | Son et al. |
| 2009/0309477 | A1 | 12/2009 | Bang et al. |
| 2012/0306938 | A1* | 12/2012 | Guo ..................... G09G 3/3406 345/102 |
| 2016/0103356 | A1* | 4/2016 | Shin .................... G02F 1/13458 349/149 |
| 2017/0017108 | A1 | 1/2017 | Shin et al. |
| 2018/0088389 | A1* | 3/2018 | Furuta .................. B23K 1/0008 |
| 2018/0210271 | A1 | 7/2018 | Shin et al. |
| 2019/0214589 | A1 | 7/2019 | Watabe et al. |
| 2020/0029439 | A1 | 1/2020 | Zhang et al. |
| 2020/0057323 | A1 | 2/2020 | Son et al. |
| 2020/0249728 | A1 | 8/2020 | Jeong |
| 2020/0259056 | A1 | 8/2020 | Hong et al. |
| 2020/0292895 | A1 | 9/2020 | Park et al. |
| 2020/0400992 | A1 | 12/2020 | Bae et al. |
| 2021/0305477 | A1 | 9/2021 | Hong et al. |
| 2022/0077272 | A1 | 3/2022 | Jeong et al. |

FOREIGN PATENT DOCUMENTS

| | | |
|---|---|---|
| KR | 10-2016-0043629 A | 4/2016 |
| KR | 10-2017-0010259 A | 1/2017 |
| KR | 10-1827633 B1 | 3/2018 |
| KR | 10-2018-0062143 A | 6/2018 |
| KR | 10-2020-0021577 A | 3/2020 |
| KR | 10-2020-0080617 A | 7/2020 |
| KR | 10-2020-0082016 A | 7/2020 |
| KR | 10-2020-0095627 A | 8/2020 |
| KR | 10-2020-0099066 A | 8/2020 |
| KR | 10-2020-0145964 A | 12/2020 |
| KR | 10-2022-0032866 A | 3/2022 |

OTHER PUBLICATIONS

Written Opinion (PCT/ISA/237) issued by the International Searching Authority Jan. 18, 2022 in corresponding International Application No. PCT/KR2021/013500.

Communication issued on Dec. 4, 2023 by the European Patent Office for European Patent Application No. 21886591.3.

* cited by examiner

DISPLAY APPARATUS AND MANUFACTURING METHOD THEREOF

CROSS-REFERENCE TO RELATED APPLICATIONS

This application is a by-pass continuation of International Application No. PCT/KR2021/013500, filed on Oct. 1, 2021, which is based on and claims priority to Korean Patent Application No. 10-2020-0140688, filed on Oct. 27, 2020, in the Korean Intellectual Property Office, the disclosures of which are incorporated by reference herein in their entireties.

BACKGROUND

1. Field

The disclosure relates to a display apparatus and a manufacturing method thereof, and more particularly to a display apparatus with narrow bezels formed on four sides thereof and a manufacturing method thereof.

2. Description of Related Art

Recently, a display apparatus that displays image information is rapidly developing according to the rapid development of electronic technology.

In other words, a variety of display apparatuses that are thin, light, and less power consuming are used. Examples of such a display apparatus include a liquid crystal display (LCD), an organic light emitting diodes (OLED) display, a quantum dot light emitting diodes (QLED) display, an electroluminescent display (ELD), and the like.

Generally, the display apparatus may include a display panel that displays an image and a housing in which the display panel is accommodated. An opening that allows the front surface of the display panel to be exposed is provided on the front surface of the housing. The periphery of the opening may form a bezel.

Because the bezel is not a part that displays an image, it is preferable to narrow the bezel's width to reduce the entire size as much as possible while the display area of the display apparatus is as large as possible.

The narrower the width of the bezels on the four sides of the display apparatus, the more the user feels as if the four sides of the display apparatus are extended to infinity.

The disclosure provides a display apparatus having four narrow bezels and a method for manufacturing the same.

SUMMARY

According to an aspect of the disclosure, a display apparatus includes: a first substrate having a rectangular shape including an upper end, a left end, a right end, and a lower end, and further including a plurality of wiring pads extending to the lower end; a display layer provided on a front surface of the first substrate; a second substrate provided on a front surface of the display layer, the second substrate including an upper end, a left end, and a right end coincident with the upper end, the left end, and the right end of the first substrate, and further including a lower end shorter than the lower end of the first substrate, wherein the second substrate is configured relative to the first substrate to expose the plurality of wiring pads of the first substrate; a plurality of side wiring pads provided on the lower end of the first substrate and the lower end of the second substrate, wherein each respective side wiring pad is connected to a respective a wiring pad of the plurality of wiring pads; and a display driving circuit connected to the plurality of side wiring pads.

The display apparatus may further include an anisotropic conductive film (ACF) disposed between the plurality of side wiring pads and the display driving circuit.

Each wiring pad of the plurality of wiring pads may include an upper surface and an end, and the upper surface and the end of each wiring pad of the plurality of wiring pads may be in contact with at least one side wiring pad of the plurality of side wiring pads.

Each side wiring pad of the plurality of side wiring pads may include silver paste, and the plurality of side wiring pads may be formed by thermally transferring the plurality of side wiring pads from a plastic film to the lower end of the first substrate and the lower end of the second substrate.

The plastic film may be polyethylene terephthalate (PET).

The display driving circuit may include a plurality of 3-chip on films, and each 3-chip on film of the plurality of 3-chip on films may include a gate integrated circuit and a plurality of source integrated circuits.

The display driving circuit may further include a flexible printed circuit board connected to the plurality of 3-chip on films.

The display layer may include a liquid crystal layer, wherein the first substrate further comprises a plurality of thin film transistors configured to operate the liquid crystal layer, and wherein the second substrate further comprises a plurality of color filters.

Each thin film transistor of the plurality of thin film transistors may include a gate electrode and a source electrode, and the gate electrode and the source electrode of each thin film transistor of the plurality of thin film transistors may be connected to a wiring pad of the plurality of wiring pads.

The display apparatus may further include: a bezel formed to cover an edge of the second substrate, wherein the bezel includes a lower bezel configured to cover the plurality of side wiring pads and the display driving circuit, and wherein a width of the lower bezel is 1 mm or less.

According to as aspect of the disclosure, a method of manufacturing a display apparatus includes: forming a display panel including a first substrate, a display layer, and a second substrate; preparing a side wiring pad film including a sheet of film and a plurality of side wiring pads formed on a surface of the sheet of film; transferring the plurality of side wiring pads of the side wiring pad film to an edge of the display panel; curing the plurality of side wiring pads transferred to the edge of the display panel; and disposing a display driving circuit on the plurality of side wiring pads at the edge of the display panel.

The sheet of film may include plastic film, and the preparing a side wiring pad film may further include: applying a conductive paste to one surface of the plastic film; and forming the plurality of side wiring pads on the plastic film from the conductive paste by patterning the conductive paste through a photolithography process.

The sheet of film may include plastic film, and the transferring the plurality of side wiring pads may further include: positioning the side wiring pad film on the edge of the display panel so that the plurality of side wiring pads contact the edge of the display panel; bending upper and lower portions of the side wiring pad film to conform to a shape of the edge of the display panel; transferring the plurality of side wiring pads to the edge of the display panel by applying heat to the side wiring pad film; and removing the plastic film of the side wiring pad film.

The edge of the display panel may include an edge of the first substrate and an edge of the second substrate, the forming the display panel may further include disposing a plurality of wiring pads between the first substrate and the display layer, the plurality of wiring pads may be configured to extend to the edge of the first substrate and each wiring pad of the plurality of wiring pads may include an upper surface, the edge of the first substrate may be configured to extend beyond the edge of the second substrate and the plurality of wiring pads of the first substrate may be exposed to an outside, and the bending upper and lower portions of the side wiring pad film to conform to the shape of the edge of the display panel may further include: bending the side wiring pad film so that each respective side wiring pad of the plurality of side wiring pads of the side wiring pad film contacts the upper surface of a wiring pad of the plurality of wiring pads.

The disposing a display driving circuit on the plurality of side wiring pads at the edge the display panel may include: attaching an anisotropic conductive film to the plurality of side wiring pads; and attaching the display driving circuit to an outer surface of the anisotropic conductive film.

According to as aspect of the disclosure, a display apparatus includes: a first substrate including a plurality of wiring pads and an edge, wherein each wiring pad of the plurality of wiring pads is disposed on a first surface of the first substrate and is configured to extend to the edge of the first substrate; a display layer provided on the first surface of the first substrate; a second substrate comprising an edge, wherein the second substrate is provided on a surface of the display layer opposite from the first substrate, and wherein the plurality of wiring pads of the first substrate are exposed to an outside; a plurality of side wiring pads provided on the edge of the first substrate and the edge of the second substrate, wherein each respective side wiring pad is connected to a respective wiring pad of the plurality of wiring pads; and a display driving circuit connected to the plurality of side wiring pads.

The display apparatus may further include an anisotropic conductive film (ACF) disposed between the plurality of side wiring pads and the display driving circuit.

Each wiring pad of the plurality of wiring pads may include an upper surface and an end, and the upper surface and end of each wiring pad of the plurality of wiring pads may be in contact with at least one side wiring pad of the plurality of side wiring pads.

The plurality of side wiring pads may include silver paste, and the plurality of side wiring pads may be formed by thermally transferring the plurality of side wiring pads from a plastic film to the edge of the first substrate and the edge of the second substrate.

The display driving circuit may include a plurality of 3-chip on films, and each 3-chip on film of the plurality of 3-chip on films may include a gate integrated circuit and a plurality of source integrated circuits.

With respect to the display apparatus described herein, the plurality of side wiring pads are provided at the lower end of the display panel, and the 3-chips on film are connected to the plurality of side wiring pads. Therefore, the size of the structure connecting the wiring pads of the display panel and the 3-chips on film when viewed from the front of the display panel may be reduced.

In addition, with respect to the display apparatus described herein, the gate ICs for controlling the plurality of thin film transistors are not disposed at the upper end, the left end, and the right end of the display panel, so that the width of each of the upper bezel, the left bezel, and the right bezel covering the upper end, the left end, and the right end of the display panel may be reduced more than the width of the lower bezel.

Therefore, because each of the four side bezels is formed to have a width of 1 mm or less, the user may feel as if the four sides of the display apparatus are extended to infinity.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DISCLOSURE

Various embodiments described herein are shown by way of example to assist understanding of the disclosure, and it should be understood that the disclosure may be variously modified and implemented differently from the embodiments described herein. Further, in the accompanying drawings, the dimensions of some components may be arbitrarily exaggerated and not drawn to scale in order to aid understanding of the disclosure.

The terms 'first', 'second', etc. may be used to describe diverse components, but the components are not limited by the terms. The terms may only be used to distinguish one component from the others. For example, without departing from the scope of the disclosure, a first component may be referred to as a second component, and similarly, a second component may also be referred to as a first component.

The terms used in embodiments of the disclosure may be construed as commonly known to those skilled in the art unless otherwise defined.

Further, the terms "leading end", "rear end", "upper side", "lower side", "top end", "bottom end", etc. used in the disclosure are defined with reference to the drawings. However, the shape and position of each component are not limited by the terms.

Hereinafter, a display apparatus according to an embodiment of the disclosure will be described in detail with reference to the accompanying drawings.

Figure 1:
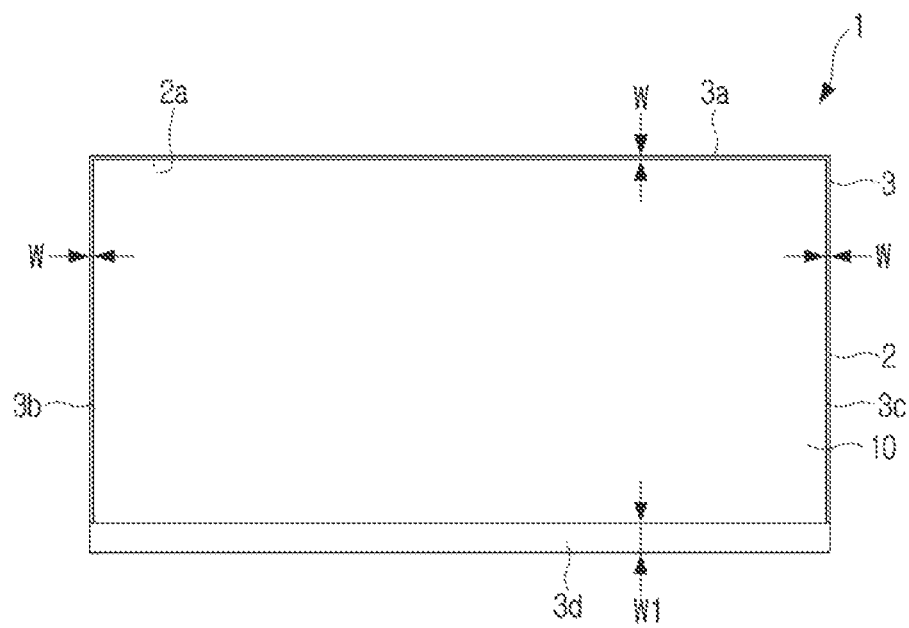
FIG. 1 is a view illustrating a display apparatus having a narrow bezel on three sides thereof.

FIG. 1 is a view illustrating a display apparatus having a narrow bezel on three sides thereof. FIG. 1 illustrates a television (TV) as an example of the display apparatus.

Referring to FIG. 1, a display apparatus 1 may include a display panel 10 and a housing 2 accommodating the display panel 10.

The display panel 10 is disposed inside the housing 2, and the front surface of the display panel 10 forms a display portion on which an image is displayed.

An opening 2a through which the display panel 10 is exposed is formed on the front surface of the housing 2. The periphery of the opening 2a of the housing 2 forms a bezel 3.

The bezel 3 includes an upper bezel 3a covering the upper end of the display panel 10, a left bezel 3b covering the left end of the display panel 10, a right bezel 3c covering the right end of the display panel 10, and a lower bezel 3d covering the lower end of the display panel 10.

The three-sided bezel, that is, the upper bezel 3a, the left bezel 3b, and the right bezel 3c, is formed with a narrow width W, but the lower bezel 3d may be formed with a wide width W1. For example, the width W of the three sided bezels 3a, 3b, and 3c is 0.5 mm, and the width W1 of the lower bezel 3d is 7.7 mm.

Figure 2:
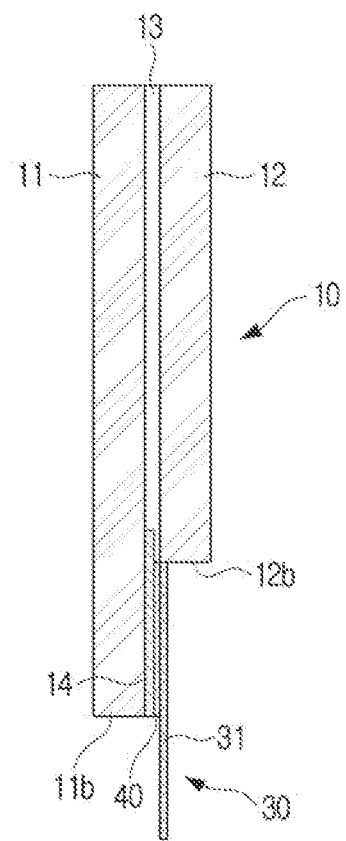
FIG. 2 is a partial view illustrating a display panel of the display apparatus of FIG. 1.
Figure 3:
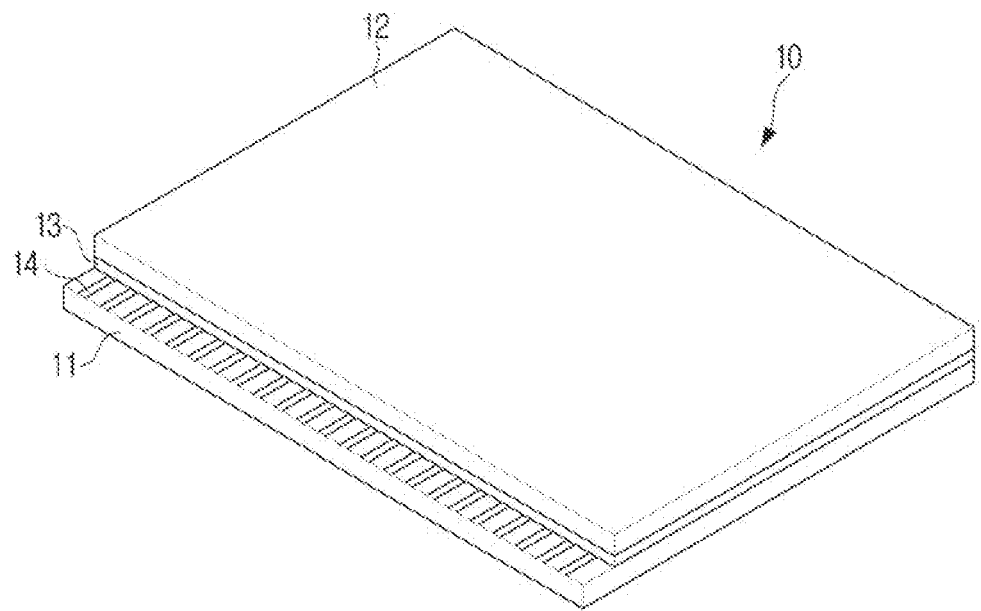
FIG. 3 is a perspective view illustrating the display panel of FIG. 2 from which a display driving circuit is removed.

The display panel 10 of the display apparatus 1 having such a structure has a structure as illustrated in FIGS. 2 and 3.

Hereinafter, the display panel 10 used in the display apparatus 1 of FIG. 1 will be described in detail with reference to FIGS. 2 and 3.

FIG. 2 is a partial view illustrating a display panel of the display apparatus of FIG. 1. FIG. 3 is a perspective view illustrating the display panel of FIG. 2 from which a display driving circuit is removed.

Referring to FIGS. 2 and 3, the display panel 10 may include a first substrate 11, a display layer 13, and a second substrate 12.

The first substrate 11 may be formed in a rectangular shape including an upper end, a left end, a right end, and a lower end. The first substrate 11 may include a plurality of wiring pads 14 formed to extend to the lower end on the front surface thereof.

The first substrate 11 is a base substrate for supporting various elements of the display panel 10, and may be formed of an insulating substrate. For example, the first substrate 11 may be formed of glass or plastic.

As another example, the first substrate 11 may be formed of a flexible material capable of being bent. For example, the first substrate 11 may be formed of thin glass or polyimide (PI) having a flexible property.

The first substrate 11 may be formed as a thin film transistor substrate having a plurality of thin film transistors formed on the front surface thereof. The plurality of wiring pads 14 may be formed at a lower portion of the front surface of the first substrate 11 to be electrically connected to gate electrodes, source electrodes, and drain electrodes of the plurality of thin film transistors.

In detail, the gate electrodes of the plurality of the thin film transistors do not extend to the left end or the right end of the first substrate 11 but to the lower end of the first substrate 11. Accordingly, a gate integrated circuit (IC) configured to control the gates of the plurality of thin film transistors is not disposed at the left end or the right end of the first substrate 11.

The display layer 13 may be provided on the front surface of the first substrate 11. The display layer 13 may form a plurality of pixels capable of displaying images. The display layer 13 may be formed in various ways according to the type of the display apparatus 1.

For example, when the display apparatus 1 is a liquid crystal display as in this embodiment, the display layer 13 may be formed of a liquid crystal layer. However, the display apparatus 1 according to the disclosure is not limited thereto.

As another example, when the display apparatus 1 is an organic light emitting diode display, the display layer 13 may be formed of a plurality of organic light emitting elements.

The second substrate 12 is provided on the front surface of the display layer 13, and may be formed in a rectangular shape including an upper end, a left end, a right end, and a lower end. The upper end, the left end, and the right end of the second substrate 12 are formed to coincide with the upper end, the left end, and the right end of the first substrate 11. The lower end 12b of the second substrate 12 is shorter than the lower end 11b of the first substrate 11. In other words, as illustrated in FIG. 3, the lower end 11b of the first substrate 11 is formed to extend longer than the lower end 12b of the second substrate 12, so that the plurality of wiring pads 14 provided on the front surface of the first substrate 11 are exposed without being covered by the second substrate 12.

The plurality of wiring pads 14 on the front surface of the first substrate 11 may be electrically connected to a display driving circuit 30 configured to operate the plurality of thin film transistors.

The display driving circuit 30 may include a 3-chips on film 31 electrically connected to the plurality of wiring pads 14 and a printed circuit board 32 electrically connected to the 3-chips on film 31.

In order to connect the plurality of wiring pads 14 on the front surface of the first substrate 11 and the 3-chips on film 31, an anisotropic conductive film (ACF) 40 may be disposed between the plurality of wiring pads 14 and the 3-chips on film 31.

In detail, as illustrated in FIG. 2, when the anisotropic conductive film 40 is attached to the front surface of the plurality of wiring pads 14 of the first substrate 11, and then the 3-chips on film 31 is disposed on the front surface of the anisotropic conductive film 40, the plurality of wiring pads 14 of the first substrate 11 and the 3-chips on film 31 may be electrically connected to each other.

Hereinafter, the display panel 10 and the display driving circuit 30 of the display apparatus 1 will be described in detail with reference to FIG. 4.

Figure 4:
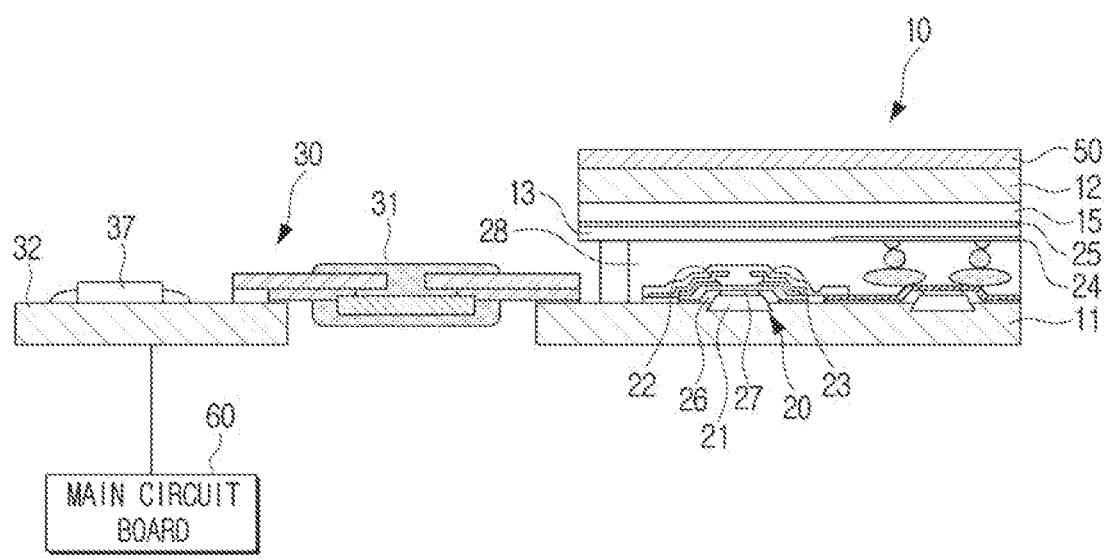
FIG. 4 is a partial cross-sectional view illustrating a state in which a display panel of a display apparatus is connected to a display driving circuit.

FIG. 4 is a partial cross-sectional view illustrating a state in which a display panel of a display apparatus is connected to a display driving circuit.

Referring to FIG. 4, the display panel 10 may include the first substrate 11, the display layer 13, and the second substrate 12.

A plurality of thin film transistors 20 and a pixel electrode 24 may be provided on the upper surface of the first substrate 11.

A color filter 15 may be provided on the lower surface of the second substrate 12, and a common electrode 25 may be provided below the color filter 15.

The display layer 13 may be provided between the first substrate 11 and the second substrate 12. The display layer 13 may be formed as a liquid crystal layer. Therefore, the common electrode 25 may be provided between the liquid crystal layer 13 and the color filter 15.

For example, a gate electrode 21 may be formed on the first substrate 11 and a gate insulating layer 26 may be formed on the gate electrode 21. A semiconductor layer 27 may be formed on the upper side of the gate insulating layer 26 corresponding to the gate electrode 21, and a source electrode 22 and a drain electrode 23 may be formed spaced apart from each other on the upper side of the semiconductor layer 27.

The gate electrode 21, the semiconductor layer 27, the source electrode 22, and the drain electrode 23 may constitute the thin film transistor (TFT) 20. Although the thin film transistor 20 having the bottom gate structure is shown in FIG. 4, the disclosure is not limited thereto. For example, the thin film transistors 20 may be formed in a top gate structure.

A protective layer 28 may be formed on the upper side of the thin film transistors 20, and the pixel electrode 24 connected to the drain electrode 23 may be formed on the upper side of the protective layer 28.

A common electrode 25 may be formed on the upper side of the pixel electrode 24. As one embodiment, the liquid crystal layer 13 may be provided between the pixel electrode 24 and the common electrode 25.

The color filter 15 may be formed on the upper side of the common electrode 25.

When the thin film transistors 20 are turned on according to a gate signal applied to the gate electrode 21, a data signal is applied to the pixel electrode 24 through the thin film transistor 20, so that an electric field is generated between the pixel electrode 24 and the common electrode 25. Then, a plurality of liquid crystal molecules of the liquid crystal layer 13 are rearranged according to the electric field so that the corresponding pixel may display a gray level corresponding to the data signal.

The thin film transistor 20, the pixel electrode 24, and the common electrode 25 may each extend through conductive lines and may be electrically connected to the plurality of wiring pads 14 of the first substrate 11.

A polarization layer 50 may be disposed on the upper surface of the display panel 10. For example, the polarization layer 50 may be disposed on the upper surface of the second substrate 12. The polarization layer 50 may be formed of a polarization film.

However, this is an example, and the polarization layer 50 may be formed on both the upper and lower surfaces of the display panel 10. For example, the polarization layer 50 may be disposed on both the lower surface of the first substrate 11 and the upper surface of the second substrate 12.

The display panel 10 may be electrically connected to the display driving circuit 30.

The first substrate 11 of the display panel 10 may include a plurality of gate lines extending in a first direction, for example, in a horizontal direction (row direction). Also, the first substrate 11 may include a plurality of data lines extending in a second direction perpendicular to the first direction, for example, in a vertical direction (column direction).

As such, each of the plurality of gate lines and the plurality of data lines crossing each other at right angles may define a pixel.

Each pixel of the display panel 10 may include a thin film transistor 20, liquid crystal, and a color filter. As an embodiment, each pixel may include three sub-pixels each displaying red, green, and blue colors.

The display driving circuit 30 may include a timing controller 37, a gate driver, and a data driver.

The timing controller 37 may receive image data and control signals such as a vertical sync signal, a horizontal sync signal, a main clock signal, a data enable signal, and the like from a main circuit board 60 that controls the display apparatus 1.

The timing controller 37 may generate a data control signal (DCS) for controlling the data driver based on the input control signal. For example, the data control signal (DCS) may include a source start pulse (SSP), a source sampling clock (SSC), a source output enable signal (SOE), a polarity signal (POL), etc.

In addition, the timing controller 37 may receive image data, align them, and transmit them to the data driver.

The timing controller 37 may generate a gate control signal (GCS) for controlling the gate driver in response to the control signal.

The data driver may supply a data voltage to the plurality of data lines in response to the data control signal (DCS) and image data. As an embodiment, the data driver may be implemented with the source IC 34 (see FIG. 5).

The gate driver may sequentially select a plurality of gate lines in response to the gate control signal (GCS) supplied from the timing controller 37 and output a turn-on voltage to the selected gate line. The thin film transistor 20 connected to the corresponding gate line may be turned on by the turn-on voltage. As one embodiment, the gate driver may be implemented as a gate IC 33 (see FIG. 5).

Figure 5:
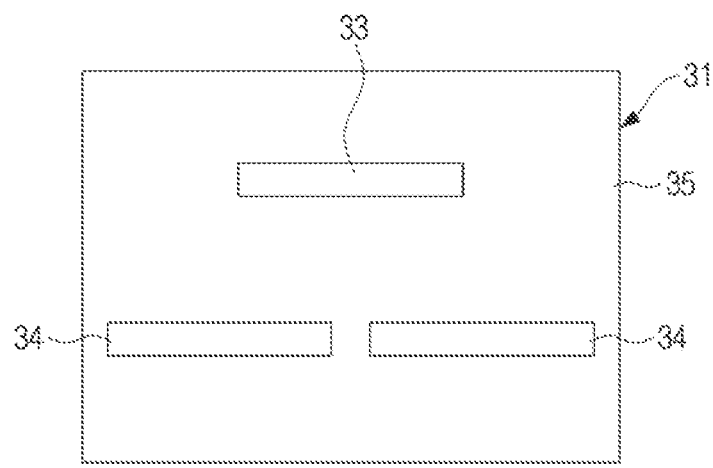
FIG. 5 is a view illustrating a 3-chips on film used in a display apparatus according to an embodiment of the disclosure.

In the case of this embodiment, as illustrated in FIG. 5, one gate IC 33 and two source ICs 34 are disposed on a film 35 to form a 3-chips on film 31. FIG. 5 is a view illustrating a 3-chips on film used in a display apparatus according to an embodiment of the disclosure.

The timing controller 37 may be disposed on a circuit board 32. The circuit board 32 may be electrically connected to the 3-chips on film 31. As an example, the circuit board 32 may be formed of a flexible circuit board having bendability.

When the display apparatus 1 is implanted as a liquid crystal display, the display apparatus 1 may include a backlight. The backlight serves to supply light to the display panel 10. As a light source for the backlight, a cold cathode fluorescent lamp (CCFL), an external electrode fluorescent lamp (EEEL), a light emitting diode (LED), or the like may be used.

Hereinafter, the display apparatus 1 according to an embodiment of the disclosure will be described in detail with reference to FIG. 6.

Figure 6:
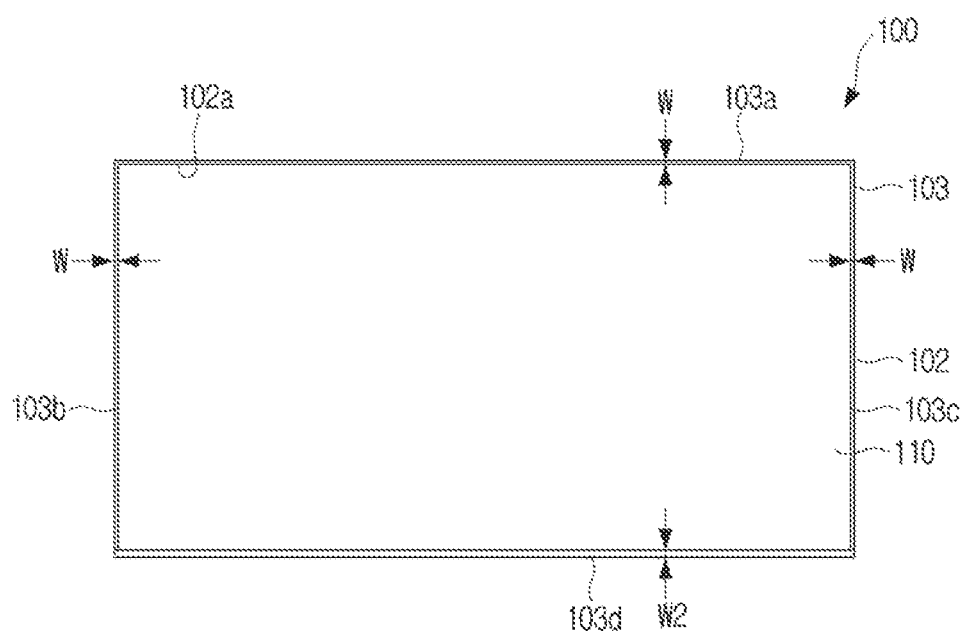
FIG. 6 is a view illustrating a display apparatus according to an embodiment of the disclosure.

FIG. 6 is a view illustrating a display apparatus according to an embodiment of the disclosure. FIG. 6 illustrates a TV as an example of the display apparatus.

Referring to FIG. 6, a display apparatus 100 may include a display panel 110 and a housing 102 accommodating the display panel 110.

The display panel 110 is disposed inside the housing 102, and the front surface of the display panel 110 forms a display portion on which an image is displayed.

An opening 102a through which the front surface of the display panel 110 is exposed may be formed on the front surface of the housing 102. The periphery of the opening 102a of the housing 102 forms a bezel 103.

The bezel 103 may include an upper bezel 103a covering the upper end of the display panel 110, a left bezel 103b and a right bezel 103c covering the left and right ends of the display panel 110, and a lower bezel 103d covering the lower end of the display panel 110.

The four-sided bezel, that is, the upper bezel 103a, the left bezel 103b, the right bezel 103c, and the lower bezel 103d, may be formed to have a narrow width W. For example, the width W of the four-sided bezel 103 may be formed to be 1 mm or less.

As an example, the width W2 of the lower bezel 103d may be slightly wider than the width W of the other three bezels 103a, 103b, and 103c. For example, the width W of the three sided bezels 103a, 103b, and 103c may be 0.5 mm, and the width W2 of the lower bezel 103d may be 1 mm.

Figure 7:
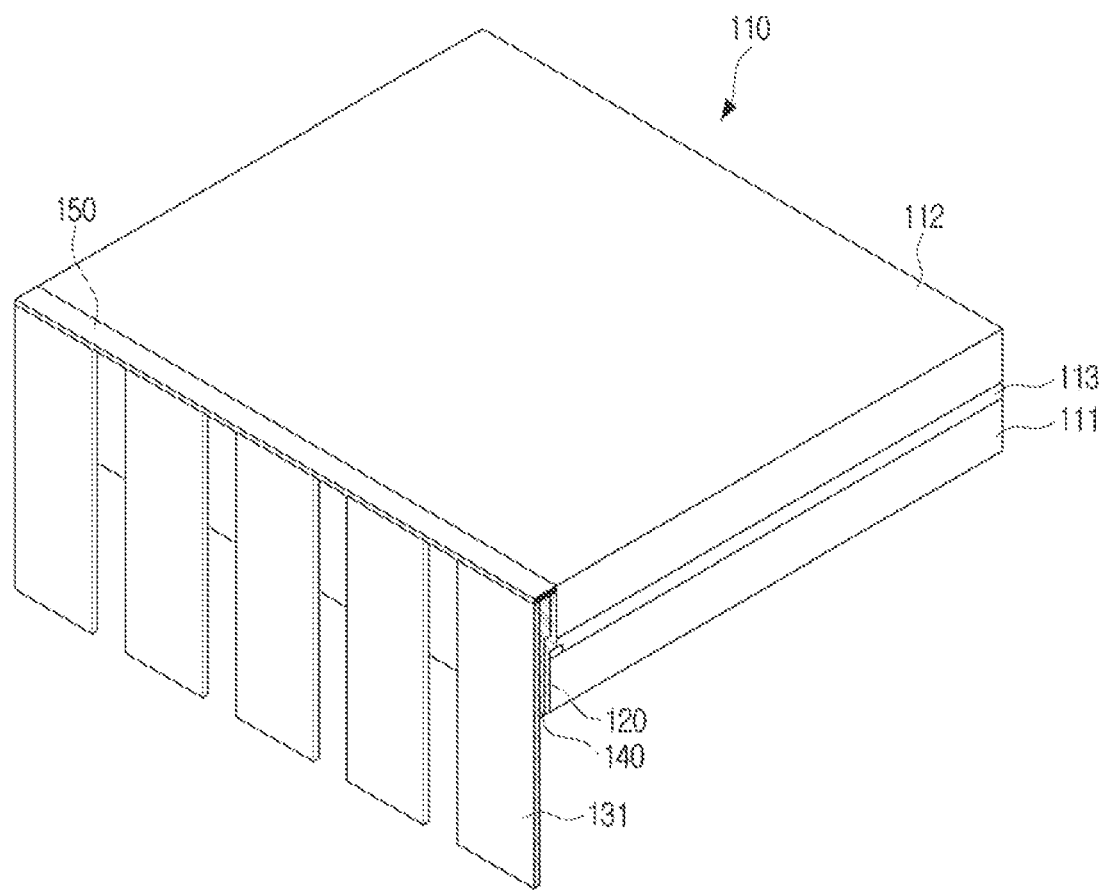
FIG. 7 is a perspective view illustrating a state in which a 3-chips on film is disposed on a display panel of a display apparatus according to an embodiment of the disclosure.
Figure 8:
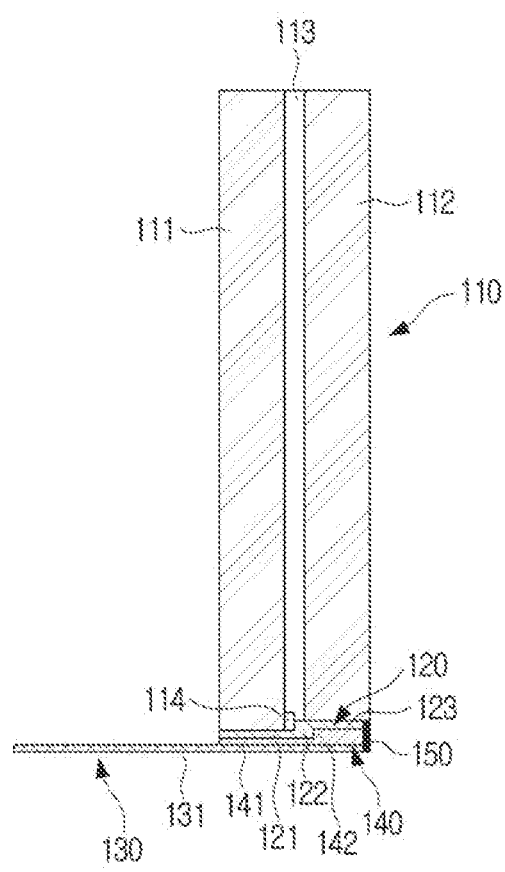
FIG. 8 is a side view of the display panel and the 3-chips on film of FIG. 7.
Figure 9:
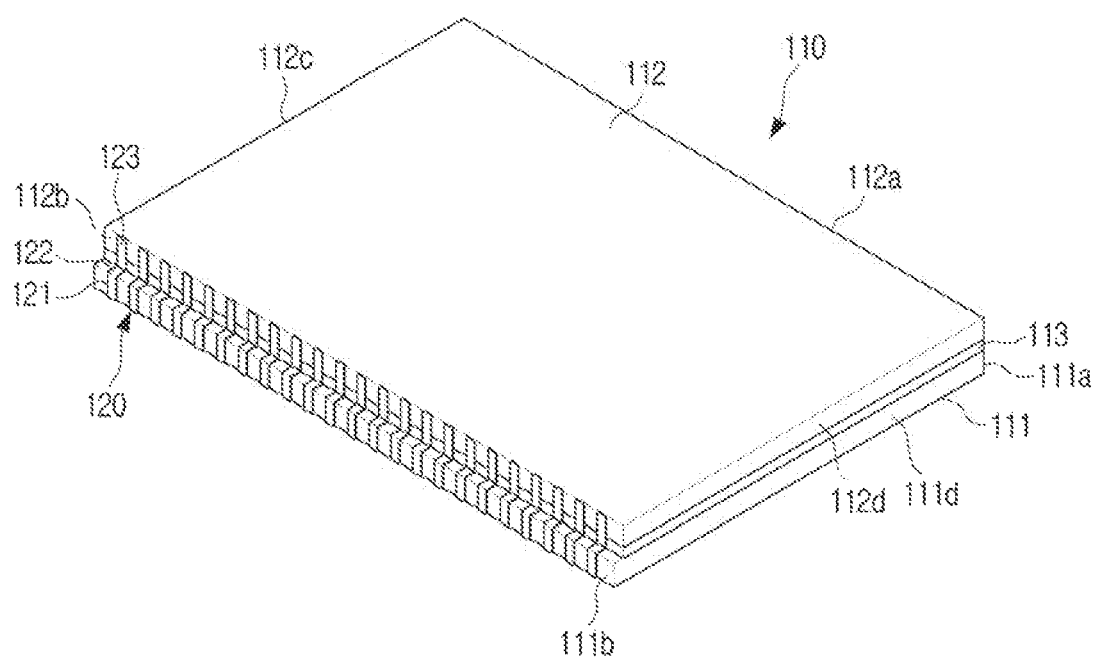
FIG. 9 is a perspective view illustrating a display panel of a display apparatus according to an embodiment of the disclosure.

The display panel 110 of the display apparatus 100 having such a structure has a structure as illustrated in FIGS. 7 to 9.

Hereinafter, the display panel 110 used in the display apparatus 100 of FIG. 6 will be described in detail with reference to FIGS. 7 to 9.

FIG. 7 is a perspective view illustrating a state in which a 3-chips on film is disposed on a display panel of a display apparatus according to an embodiment of the disclosure. FIG. 8 is a side view of the display panel and the 3-chips on film of FIG. 7. FIG. 9 is a perspective view illustrating a display panel of a display apparatus according to an embodiment of the disclosure.

Referring to FIGS. 7 to 9, the display panel 110 may include a first substrate 111, a display layer 113, and a second substrate 112.

The first substrate 111 may be formed in a rectangular shape including an upper end 111a, a left end, a right end 111d, and a lower end 111b. The first substrate 111 may include a plurality of wiring pads 114 formed to extend to the lower end on the front surface thereof.

The first substrate 111 is a base substrate for supporting various elements of the display panel 110, and may be formed of an insulating substrate. For example, the first substrate 111 may be formed of glass or plastic.

As another embodiment, the first substrate 111 may be formed of a flexible material capable of being bent. For example, the first substrate 111 may be formed of thin glass or polyimide (PI) having a flexible property.

The first substrate 111 may be formed as a thin film transistor substrate having a plurality of thin film transistors formed on the front surface thereof. The plurality of wiring pads 114 may be formed at a lower portion of the front surface of the first substrate 111 to be electrically connected to gate electrodes, source electrodes, and drain electrodes of the plurality of thin film transistors.

In detail, the gate electrodes of the plurality of the thin film transistors may be formed to extend to the lower end 111b of the first substrate 111 without extending to one side of the first substrate 111, that is, to the left end or the right end 111d of the first substrate 111. Accordingly, a gate IC configured to control the gates of the plurality of thin film transistors is not disposed on the left end or the right end 111d of the first substrate 111.

The display layer 113 may be provided on the front surface of the first substrate 111. The display layer 113 may form a plurality of pixels capable of displaying images. The display layer 113 may be formed in various ways according to the type of the display apparatus 100. For example, when the display apparatus 100 is a liquid crystal display as in this embodiment, the display layer 113 may be formed of a liquid crystal layer. However, the display apparatus 100 according to the disclosure is not limited thereto.

As another example, when the display apparatus 100 is implemented as an organic light emitting diode display, the display layer 113 may be formed of a plurality of organic light emitting diodes.

The second substrate 112 is provided on the front surface of the display layer 113, and may be formed in a rectangular shape including an upper end 112a, a left end 112c, a right end 112d, and a lower end 112b.

The upper end 112a, the left end 112c, and the right end 112d of the second substrate 112 are formed to coincide with the upper end 111a, the left end, and the right end 111d of the first substrate 111. The lower end 112b of the second substrate 112 may be shorter than the lower end 111b of the first substrate 111. In other words, the lower end 111b of the first substrate 111 may be formed to extend longer than the lower end 112b of the second substrate 112, so that the plurality of wiring pads 114 provided on the front surface of the first substrate 111 are exposed without being covered by the second substrate 112.

A plurality of side wiring pads 120 may be provided on the lower end of the display panel 110. For example, the plurality of side wiring pads 120 may be disposed on the lower end 111b of the first substrate 111 and the lower end 112b of the second substrate 112, and may be formed to contact the plurality of wiring pads 114 of the first substrate 111.

The plurality of side wiring pads 120 may be disposed to be spaced apart at regular intervals in the longitudinal direction of the display panel 110. In detail, as illustrated in FIG. 9, each of the plurality of side wiring pads 120 may be formed to have a length corresponding to the thickness of the display panel 110. Therefore, each of the side wiring pads 120 may have a length corresponding to the sum of the thickness of the lower end 111b of the first substrate 111, the thickness of the lower end of the display layer 113, and the thickness of the lower end 112b of the second substrate 112.

The side wiring pad 120 may be formed in a shape that is bent twice in a shape corresponding to the step at the lower end of the display panel 110. In other words, the side wiring pad 120 may be formed to contact one end 114a (see FIG. 10) and the upper surface 114b (see FIG. 10) of the wiring pad 14 of the first substrate 11.

For example, the side wiring pad 120 may include a first pad portion 121 contacting the lower end 111b of the first substrate 11 and the one end 114a of the wiring pad 114, a second pad portion 122 contacting the upper surface 114b of the wiring pad 114 of the first substrate 111, and a third pad portion 123 contacting the lower end 112b of the second substrate 112.

Therefore, the side wiring pad 120 contacts the upper surface 114b and the one end 114a of the wiring pad 114 of the first substrate 111 that are not covered by the second substrate 112, so that the contact area between the side wiring pad 120 and the wiring pad 114 is widened.

The plurality of side wiring pads 120 may be formed of conductive paste. For example, the plurality of side wiring pads 120 may be formed of silver paste. However, the material of the side wiring pads 120 is not limited thereto. For example, the side wiring pads 120 may be formed of a conductive paste containing at least one of silver (Ag), copper (Cu), gold (Au), and aluminum (Al).

As an example, the plurality of side wiring pads 120 may be formed by thermally transferring a plurality of side wiring pads formed of silver paste on a plastic film to the lower end of the display panel 110, that is, the lower end 111b of the first substrate 111 and the lower end 112b of the second substrate 112. The plastic film may be formed of polyethylene terephthalate (PET).

The plurality of side wiring pads 120 provided on the lower end of the display panel 110 may be electrically connected to the display driving circuit 130 configured to operate the plurality of thin film transistors of the first substrate 111.

The display driving circuit 130 may include a 3-chips on film 131 electrically connected to the plurality of side wiring pads 120 and a printed circuit board connected to the 3-chips on film 131.

The 3-chips on film 131 and the printed circuit board of the display driving circuit 130 according to this embodiment are the same as the 3-chips on film 31 and the printed circuit board 32 of the display driving circuit 30 of the display apparatus 1 described above; therefore, detailed descriptions thereof are omitted.

In order to connect the plurality of side wiring pads 120 on the lower end of the display panel 110 and the 3-chips on film 131, an anisotropic conductive film (ACF) 140 may be disposed between the plurality of side wiring pads 120 and the 3-chips on film 131.

In detail, as illustrated in FIGS. 7 and 8, when the anisotropic conductive film 140 is attached to the lower surface of the plurality of side wiring pads 120 of the display panel 110 and the 3-chips on films 131 are disposed on the lower surface of the anisotropic conductive film 140, the side wiring pads 120 of the display panel 110 and the 3-chips on films 131 may be electrically connected to each other.

In this case, the anisotropic conductive film 140 may be formed to flatten the lower end of the display panel 110. For example, the anisotropic conductive film 140 may be formed to fill the steps of the side wiring pads 120. In other words, a first portion 141 of the anisotropic conductive film 140 corresponding to the first pad portions 121 of the side wiring pads 120 may be formed thinly, and a second portion 142 of the anisotropic conductive film 140 corresponding to the third pad portions 123 of the side wiring pads 120 may be formed such that it is thicker than first portion 141.

When the anisotropic conductive film 140 is formed in this way, the 3-chips on film 131 may be stably disposed on the lower end of the display panel 110.

A black matrix 150 may be provided at front ends of the side wiring pads 120, the anisotropic conductive film 140, and the 3-chips on film 131. The black matrix 150 may be provided to cover the side wiring pads 120, the anisotropic conductive film 140, and the 3-chips on film 131. The black matrix 150 may be formed of black ink. The black matrix 150 of the display panel 110 may be covered by the bezel 103d (see FIG. 10).

Figure 10:
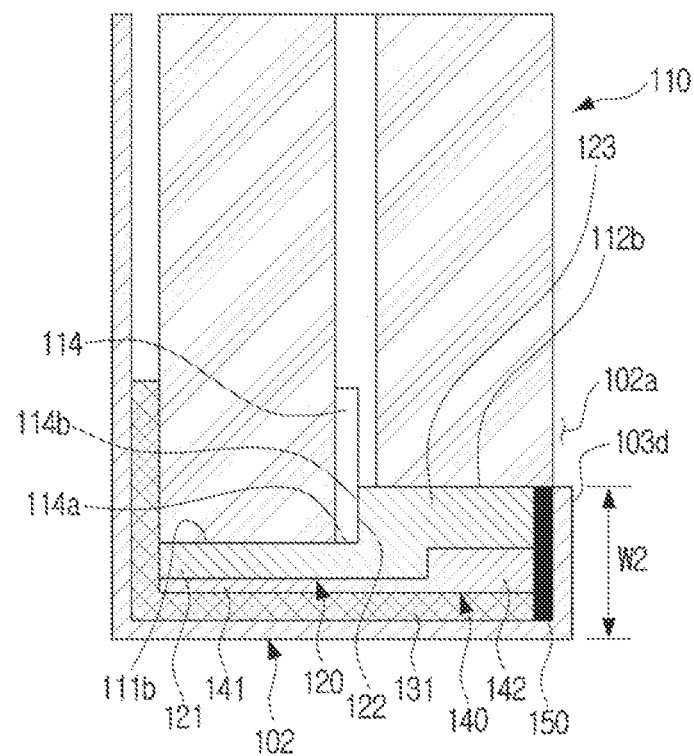
FIG. 10 is a partial cross-sectional view illustrating a lower portion of a display apparatus according to an embodiment of the disclosure.

FIG. 10 is a partial cross-sectional view illustrating a lower portion of a display apparatus according to an embodiment of the disclosure.

Referring to FIG. 10, the side wiring pads 120, the anisotropic conductive film 140, and the 3-chips on film 131 disposed on the lower end of the display panel 110 may be covered by the housing 102. In detail, the black matrix 150 of the display panel 110 may be covered by the lower bezel 103d of the housing 102.

Because the 3-chips on film 131 are formed to be flexible, the 3-chips on film 131 may be accommodated inside the housing 102 while being bent toward the rear side of the display panel 110.

In addition, the 3-chips on film 131 may be electrically connected to a printed circuit board. The printed circuit board may be provided with a timing controller for controlling a gate IC and a source IC of the 3-chips on film 131. As an example, the printed circuit board may be formed as a flexible printed circuit board. The printed circuit board may be electrically connected to a main circuit board configured to control the display apparatus 100.

As described above, when the plurality of side wiring pads 120 are formed on the lower end of the display panel 110 and the display driving circuit 130 is connected to the side wiring pads 120, the width W2 of the lower bezel 103d may be reduced. For example, in the case of the display apparatus 100 according to this embodiment, the width W2 of the lower bezel 103d may be reduced to 1 mm or less.

While the disclosure describes an embodiment where there is the step at the lower end of the display panel 110, the disclosure is not limited thereto. As another example, the step may not be formed at the lower end of the display panel. Hereinafter, a display panel 110' having no step will be described with reference to FIG. 11.

Figure 11:
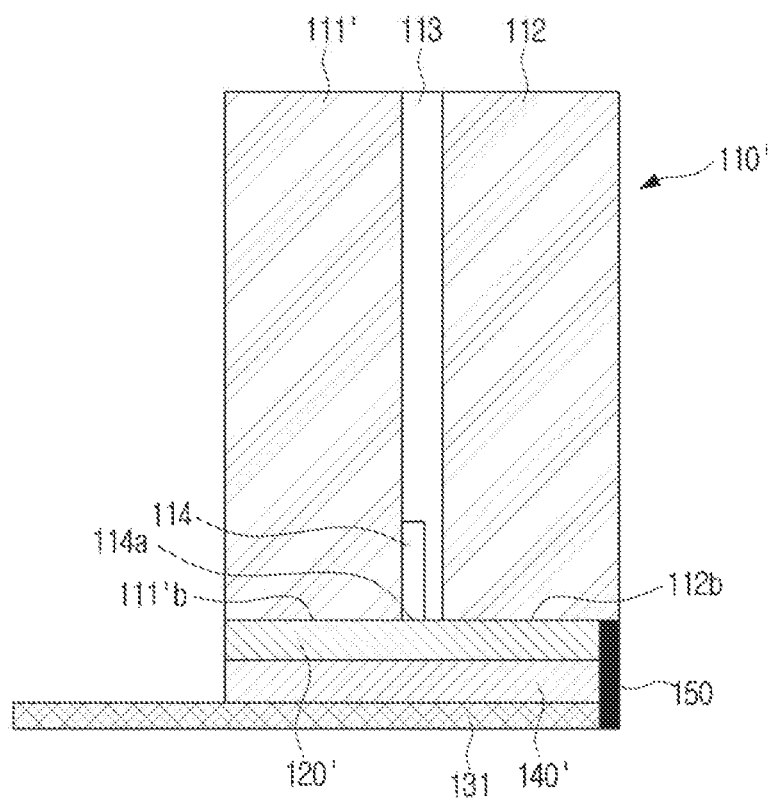
FIG. 11 is a partial view illustrating another example of a display panel of a display apparatus according to an embodiment of the disclosure.

FIG. 11 is a partial view illustrating another example of a display panel of a display apparatus according to an embodiment of the disclosure.

Referring to FIG. 11, the display panel 110' may include a first substrate 111', a display layer 113, and a second substrate 112.

Unlike the display panel 110 according to the above-described embodiment, the display panel 110' according to this embodiment is formed so that the lower end 111'b of the first substrate 111 is formed to coincide with the lower end 112b of the second substrate 112. In other words, the lower end 111'b of the first substrate 111 and the lower end 112b of the second substrate 112 are formed to form the same plane.

Accordingly, the upper surfaces of the plurality of wiring pads 114 formed on the front surface of the first substrate 111' are not exposed to the outside, and only one end 114a of the plurality of wiring pads 114 are exposed to the outside.

A plurality of side wiring pads 120' are provided on the lower end of the display panel 110'. The plurality of side wiring pads 120' are formed to contact one end 114*a* of the plurality of wiring pads 114 of the first substrate 111'.

Unlike the side wiring pads 120 according to the previously-described embodiment, the side wiring pads 120' may be formed in a flat plate shape without a bent portion. An anisotropic conductive film 140' is disposed on the lower surface of the side wiring pads 120'. Unlike the anisotropic conductive film 140 according to the above-described embodiment, the anisotropic conductive film 140' may be formed in a flat plate shape without a step. The 3-chips on film 131 may be disposed on the lower surface of the anisotropic conductive film 140'.

A black matrix 150 may be provided at front ends of the side wiring pads 120', the anisotropic conductive film 140', and the 3-chips on film 131.

As illustrated in FIG. 11, when the lower end of the display panel 110' is formed flat, one end 114*a* of the plurality of wiring pads 114 of the first substrate 111' are in contact with the plurality of side wiring pads 120'.

Therefore, the contact area between the wiring pads 114 and the side wiring pads 120' may be reduced compared to the contact area between the wiring pads 114 and the side wiring pads 120 of the display panel 110 according to the above-described embodiment.

Accordingly, the display panel 110 having the step as in the previously-described embodiment has a stable and reliable electrical connection between the wiring pads 114 and the side wiring pads 120 compared to the display panel 110' shown in FIG. 11.

Hereinafter, a method for manufacturing a display apparatus according to an embodiment of the disclosure will be described in detail with reference to FIGS. 12 to 16B.

Figure 12:
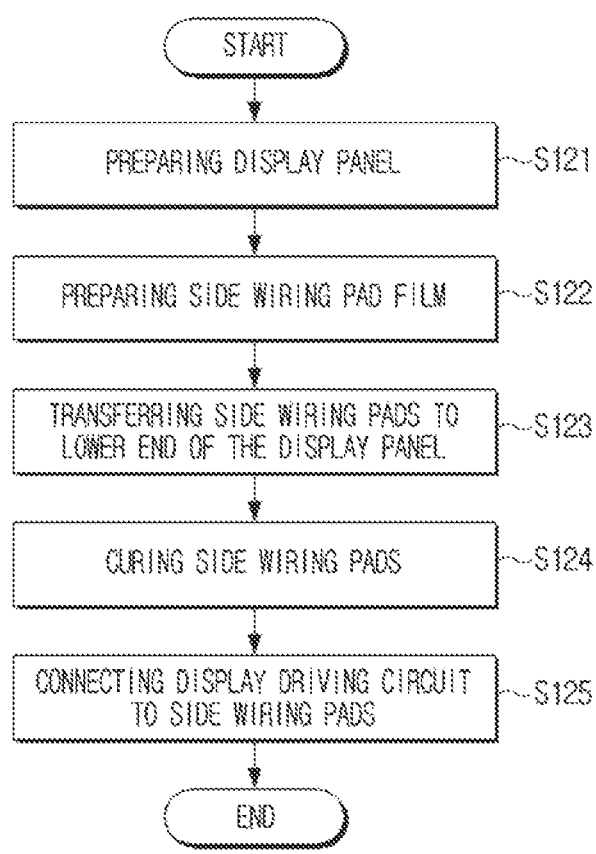
FIG. 12 is a flowchart for explaining a method for manufacturing a display apparatus according to an embodiment of the disclosure.
Figure 13A:
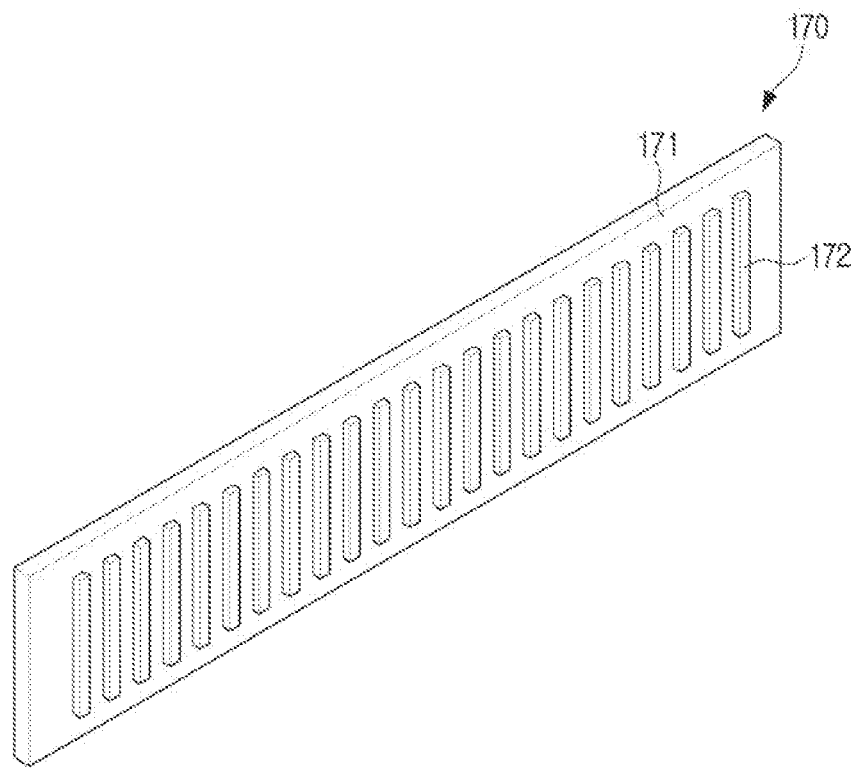
FIG. 13A is a perspective view illustrating a side wiring pad film used in a method for manufacturing a display apparatus according to an embodiment of the disclosure.
Figure 13B:
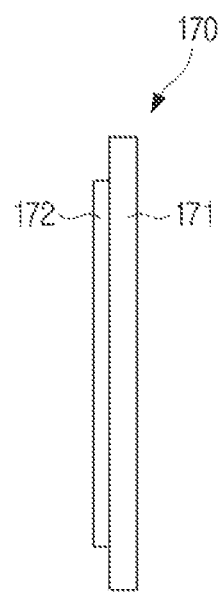
FIG. 13B is a side view illustrating a side wiring pad film used in a method for manufacturing a display apparatus according to an embodiment of the disclosure.
Figure 14A:
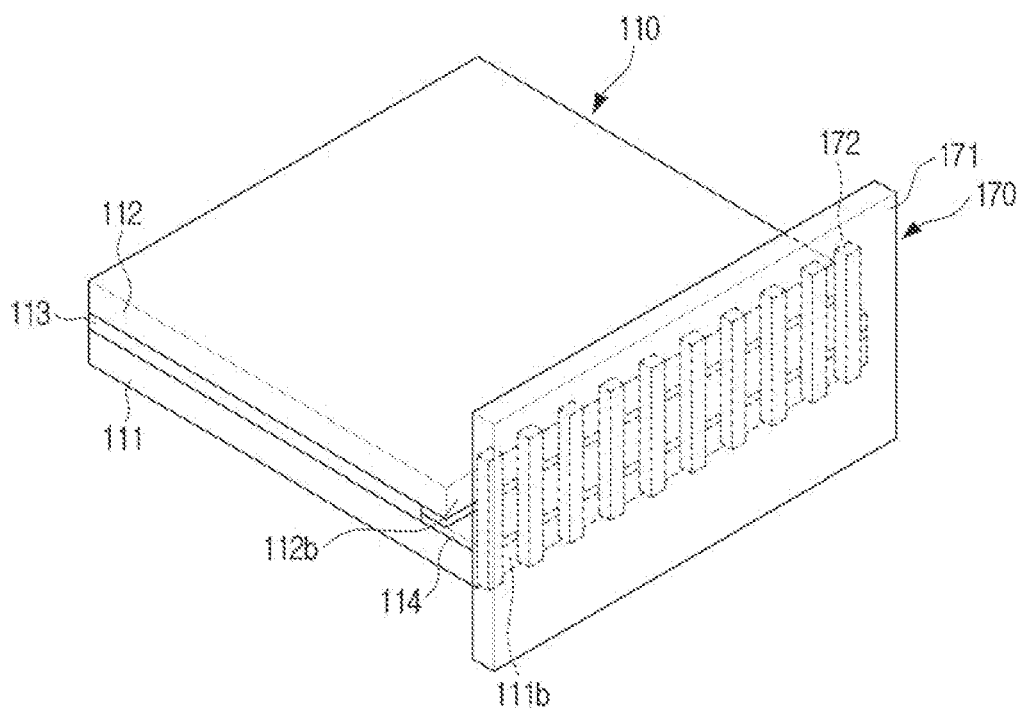
FIG. 14A is a perspective view for explaining a method for manufacturing a display apparatus according to an embodiment of the disclosure.
Figure 14B:
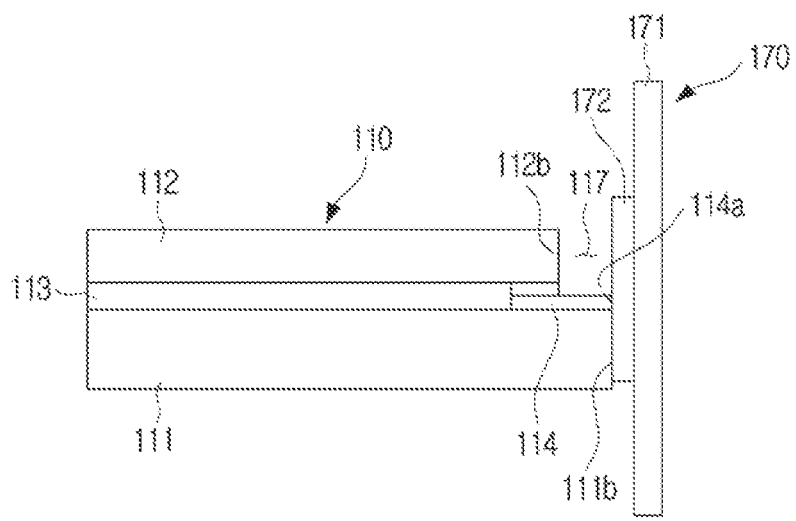
FIG. 14B is a side view for explaining a method for manufacturing a display apparatus according to an embodiment of the disclosure.
Figure 15A:
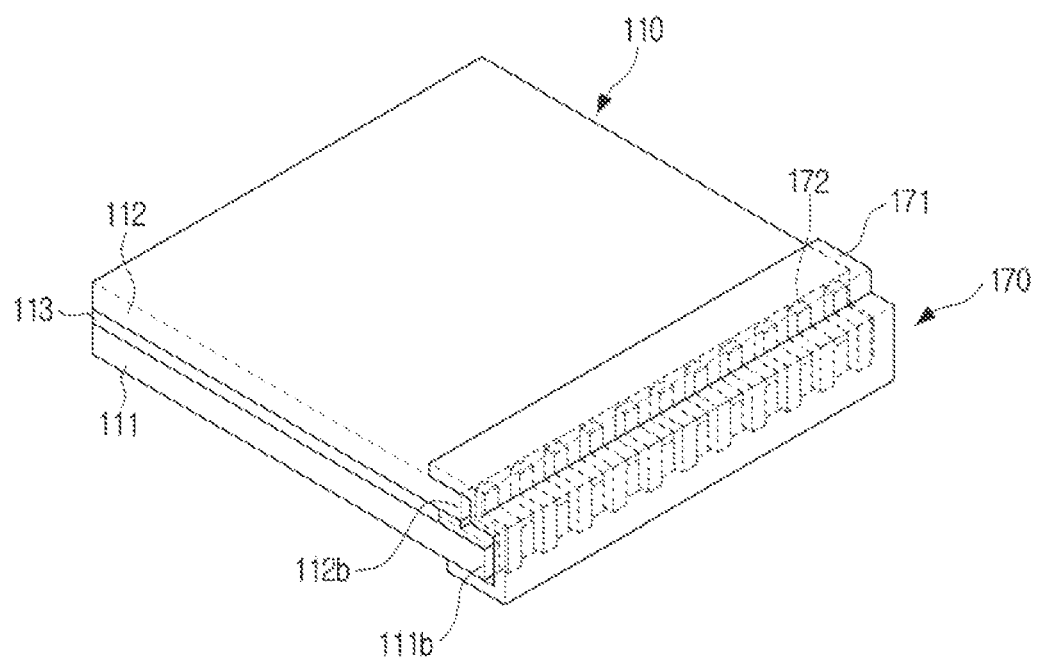
FIG. 15A is a perspective view for explaining a method for manufacturing a display apparatus according to an embodiment of the disclosure.
Figure 15B:
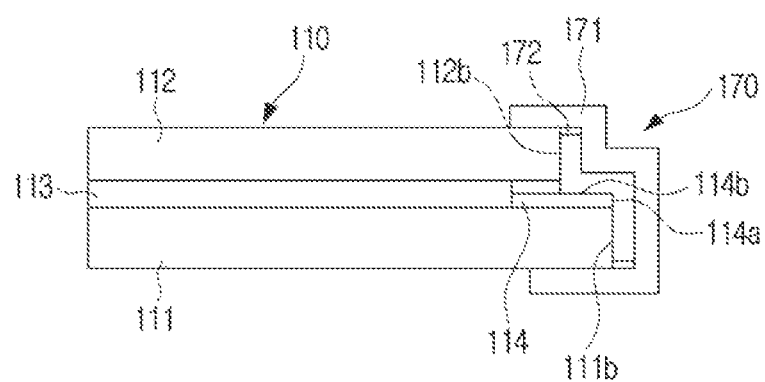
FIG. 15B is a side view for explaining a method for manufacturing a display apparatus according to an embodiment of the disclosure.
Figure 16A:
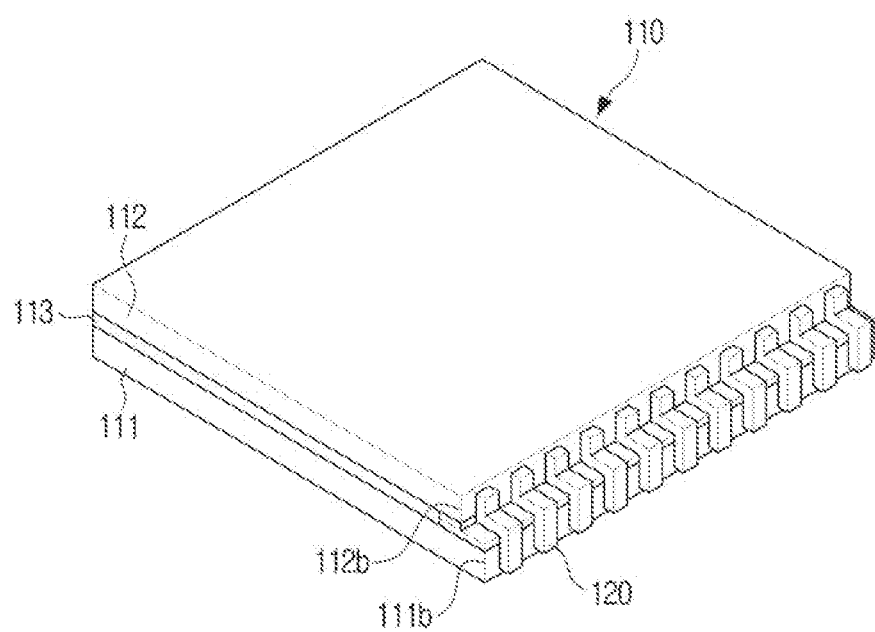
FIG. 16A is a perspective view for explaining a method for manufacturing a display apparatus according to an embodiment of the disclosure.
Figure 16B:
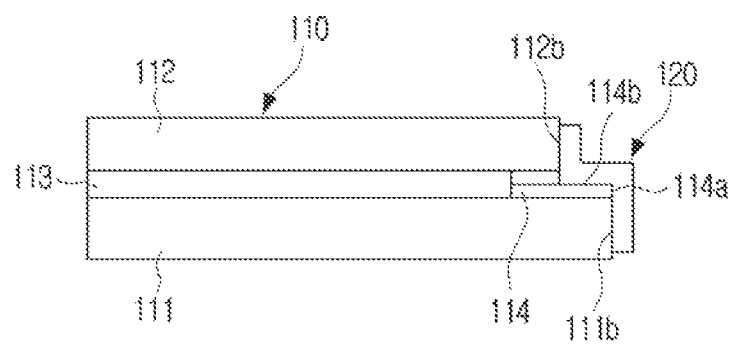
FIG. 16B is a side view for explaining a method for manufacturing a display apparatus according to an embodiment of the disclosure.

FIG. 12 is a flowchart for explaining a method for manufacturing a display apparatus according to an embodiment of the disclosure. FIGS. 13A and 13B are a perspective view and a side view, respectively, illustrating a side wiring pad film used in a method for manufacturing a display apparatus according to an embodiment of the disclosure. FIGS. 14A and 14B are a perspective view and a side view, respectively, for explaining a method for manufacturing a display apparatus according to an embodiment of the disclosure. FIGS. 15A and 15B are a perspective view and a side view, respectively, for explaining a method for manufacturing a display apparatus according to an embodiment of the disclosure. FIGS. 16A and 16B are a perspective view and a side view, respectively, for explaining a method for manufacturing a display apparatus according to an embodiment of the disclosure.

First, the display panel 110 is prepared (S121). In other words, the display panel 110 including the first substrate 111, the display layer 113, and the second substrate 112 is prepared.

As an example, a step 117 may be formed at the lower end of the display panel 110. In detail, the first substrate 111 of the display panel 110 may be formed in a rectangular shape including an upper end, a left end, a right end, and a lower end 111*b*, and may include a plurality of wiring pads 114 extending to the lower end 111*b*.

The display layer 113 may be provided on the upper surface of the first substrate 111.

The second substrate 112 is provided on the upper surface of the display layer 113, and may include an upper end, a left end, and a right end coincident with the upper end, the left end, and the right end of the first substrate 111 and a lower end 112*b* shorter than the lower end 111*b* of the first substrate 111. In other words, the step 117 may be formed between the lower end 112*b* of the second substrate 112 and the lower end 111*b* of the first substrate 111. Accordingly, the plurality of wiring pads 114 of the first substrate 111 may be exposed to one side of the lower end 112*b* of the second substrate 112.

Next, a side wiring pad film is prepared (S122). When preparing the display panel 110 as described above, the side wiring pad film 170 may be formed in another process.

As illustrated in FIGS. 13A and 13B, a plurality of side wiring pads 172 may be formed on one surface of the side wiring pad film 170.

Hereinafter, a method for manufacturing the side wiring pad film 170 will be described in detail.

First, a plastic film 171 having a size corresponding to the lower end of the display panel 110 is prepared. The plastic film 171 may be formed of a flexible material. For example, the plastic film 171 may be formed of polyethylene terephthalate (PET).

Next, a conductive paste is applied to one surface of the plastic film 171. As an example, silver paste may be used as the conductive paste. However, the conductive paste is not limited thereto. For example, the conductive paste may include at least one of silver (Ag), copper (Cu), gold (Au), and aluminum (Al).

Subsequently, the plurality of side wiring pads 172 are formed on one surface of the plastic film 171 by patterning the conductive paste through a photolithography process.

When the side wiring pad film 170 is prepared, the plurality of side wiring pads 172 of the side wiring pad film 170 are transferred to the lower end of the display panel 110 (S123). In detail, how to transfer the plurality of side wiring pads 172 to the lower end of the display panel 110 is as follows.

First, as illustrated in FIGS. 14A and 14B, the side wiring pad film 170 is placed at the lower end of the display panel 110 so that the plurality of side wiring pads 172 contacts the lower end of the display panel 110. Then, the side wiring pads 172 of the side wiring pad film 170 contact one end 114*a* of the wiring pads 114 of the first substrate 11.

Next, the side wiring pad film 170 is bent so that the upper and lower portions of the side wiring pad film 170 wrap the upper and lower surfaces of the display panel 110.

At this time, the side wiring pad film 170 is pressed so that the side wiring pad film 170 is bent in response to the step 117 of the display panel 110. Then, the plurality of side wiring pads 172 of the side wiring pad film 170 are in contact with the upper surfaces 114*b* of the plurality of wiring pads 114 of the first substrate 111.

Then, as illustrated in FIGS. 15A and 15B, the side wiring pad film 170 is bent in a manner corresponding to the step 117 of the display panel 110.

The task of bending the side wiring pad film 170 to correspond to the step 117 of the lower end of the display panel 110 may be performed using a bending tool or bending jig.

When the bending of the side wiring pad film 170 is completed, heat is applied to the side wiring pad film 170 to transfer the plurality of side wiring pads 172 to the lower end of the display panel 110.

When the transfer of the plurality of side wiring pads 172 is completed, the plastic film 171 of the side wiring pad film 170 is removed from the lower end of the display panel 110.

Subsequently, the plurality of side wiring pads 172, which were transferred to the lower end of the display panel 110, are cured (S124). Then, as illustrated in FIGS. 16A and 16B, a plurality of cured side wiring pads 120 are formed on the lower end of the display panel 110. For reference, in this description, the reference number 172 represents the side wiring pads formed on the side wiring pad film 170, and the reference number 120 represents the side wiring pads formed by transferring and curing the side wiring pads 172 of the side wiring pad film 170 to the lower end of the display panel 110.

According to the manufacturing method described above, each of the plurality of side wiring pads 120 is formed in a shape bent twice to correspond to the step 117 of the lower end of the display panel 110. In other words, the side wiring pad 120 is formed to contact one end 114a and the upper surface 114b of the wiring pad 114 of the first substrate 111.

In detail, the side wiring pad 120 includes a first pad portion 121 contacting the lower end 111b of the first substrate 111 and one end 114a of the wiring pad 114, a second pad portion 122 contacting the upper surface 114b of the wiring pad 114 of the first substrate 111, and a third pad portion 123 contacting the lower end 112b of the second substrate 112.

In this embodiment, the upper end of the side wiring pad 120 is formed at a lower position than the upper surface of the second substrate 112, and the lower end of the side wiring pad 120 is formed at a higher position than the lower surface of the first substrate 111. Therefore, the side wiring pads 120 may be disposed so that the upper end of the side wiring pad 120 does not protrude over the second substrate 112, and the lower end of the side wiring pad 120 does not protrude below the first substrate 111.

However, the length of each of the side wiring pads 120 is not limited thereto. For example, the length of each of the side wiring pads 120 may be formed larger than the thickness of the display panel 110.

Figure 17A:
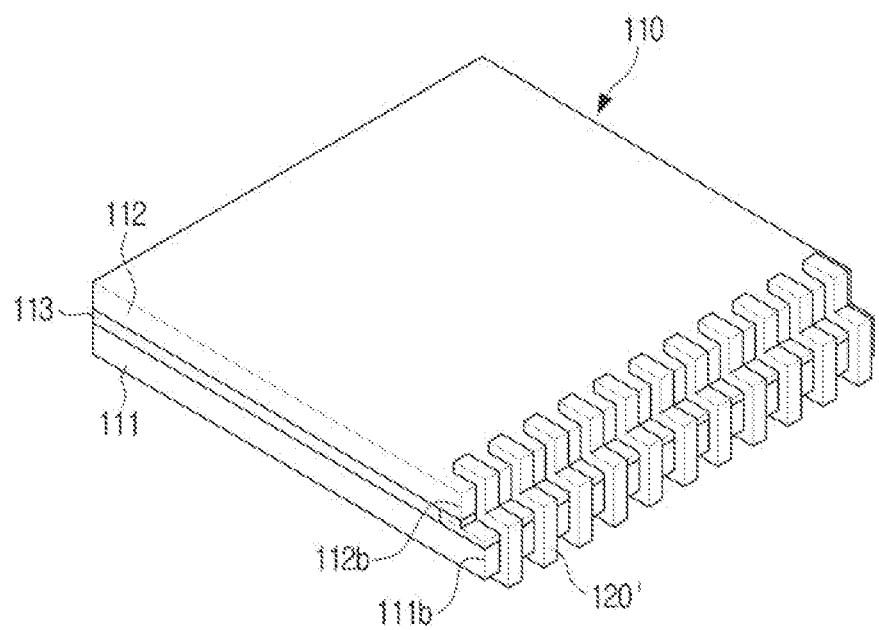
FIG. 17A is a perspective view illustrating another example of a display panel of a display apparatus according to an embodiment of the disclosure.
Figure 17B:
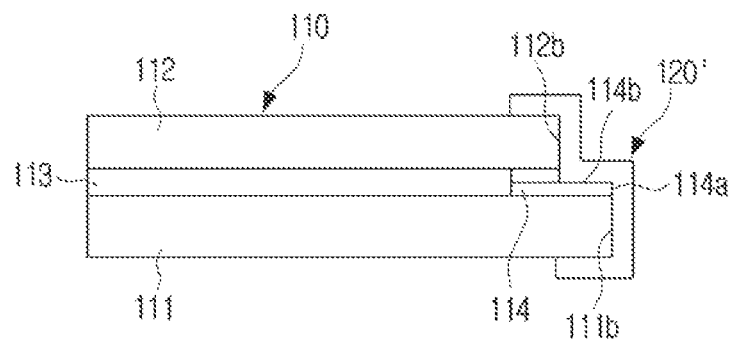
FIG. 17B is a side view illustrating another example of a display panel of a display apparatus according to an embodiment of the disclosure.

As another embodiment, as illustrated in FIGS. 17A and 17B, the side wiring pads 120' may be formed so that the upper portions of the side wiring pads 120' cover the upper surface of the second substrate 112 and the lower portions of the side wiring pads 120' cover the lower surface of the first substrate 111. Here, FIGS. 17A and 17B are a perspective view and a side view, respectively, illustrating another example of a display panel of a display apparatus according to an embodiment of the disclosure.

The side wiring pads 120' illustrated in FIGS. 17A and 17B may be formed by the same or similar manufacturing method as described above.

As another embodiment, the side wiring pads 120 may be formed so that the upper ends of the side wiring pads 120 are positioned in the same level as the upper surface of the second substrate 112 and the lower ends of the side wiring pads 120 are positioned in the same level as the lower surface of the first substrate 111.

Finally, the display driving circuit 130 is disposed on the plurality of side wiring pads 120 at the lower end of the display panel 110 (S125).

In detail, an anisotropic conductive film 140 is attached to the plurality of side wiring pads 120 at the lower end of the display panel 110.

In this case, the anisotropic conductive film 140 may be formed to make the lower end of the display panel 110 into a flat state. In other words, the anisotropic conductive film 140 may be formed to have a step corresponding to the steps of the side wiring pads 120 so that the anisotropic conductive film 140 fills the space formed by the steps of the side wiring pads 120.

In detail, the first part 141 of the anisotropic conductive film 140 corresponding to the first pad portions 121 of the side wiring pads 120 may be formed thin, and the second part 142 of the anisotropic conductive film 140 corresponding to the third pad portions 123 of the side wiring pads 120 may be formed thick. In other words, the first part 141 and the second part 142 of the anisotropic conductive film 140 may be formed to form a step corresponding to the step of the side wiring pad 120.

Next, the display driving circuit 130 is attached to the outer surface of the anisotropic conductive film 140. In detail, the 3-chips on films 131 are attached to the outer surface of the anisotropic conductive film 140 (see FIGS. 7 and 8). At this time, because the outer surface of the anisotropic conductive film 140 is formed in a plane without a step, the 3-chips on films 131 may be easily attached.

In this way, when the 3-chips on films 131 are attached to the outer surface of the anisotropic conductive film 140, the 3-chips on films 131 are electrically connected to the plurality of wiring pads 114 of the first substrate 111. Therefore, the gate ICs and the source ICs of the 3-chips on films 131 may control the thin film transistors of the first substrate 111.

The 3-chips on films 131 may be electrically connected to the flexible printed circuit board.

With the display apparatus according to an embodiment of the disclosure and the manufacturing method thereof as described above, the plurality of side wiring pads are provided at the lower end of the display panel, and the 3-chips on films are connected to the plurality of side wiring pads. Therefore, the size of the structure connecting the wiring pads of the display panel and the 3-chips on films when viewed from the front of the display panel may be reduced.

Accordingly, according to an embodiment of the disclosure, the width of the lower bezel covering the lower portion of the display panel of the display apparatus may be reduced to 1 mm or less.

In addition, with the display apparatus according to an embodiment of the disclosure, the gate ICs for controlling the plurality of thin film transistors are not disposed at the upper end, the left end, and the right end of the display panel, so that the width of each of the upper bezel, the left bezel, and the right bezel covering the upper end, the left end, and the right end of the display panel may be reduced to 0.5 mm or less.

Therefore, with the display apparatus according to an embodiment of the disclosure, each of the four side bezels is formed to have a width of 1 mm or less. Therefore, the user may feel as if the four sides of the display apparatus are extended to infinity. In particular, in the case of a display apparatus such as a TV, when the bezel width of all four sides is narrow, the effect of giving the feeling that the four sides are extended to infinity may be greater.

In the above, a TV has been described as an example of the display apparatus, but the disclosure is not limited thereto. The disclosure may be applied to various display apparatuses having a large screen, such as a monitor.

The disclosure has been described above in an exemplary manner. The terms used herein are for the purpose of description and should not be construed in a limiting sense. Various modifications and variations of the disclosure are possible according to the above contents. Accordingly, unless otherwise stated, the disclosure may be practiced freely within the scope of the claims.

What is claimed is:
1. A display apparatus comprising:
    a first substrate having a rectangular shape comprising an upper end, a left end, a right end, and a lower end, and further comprising a plurality of wiring pads extending to the lower end;

a display layer provided on a front surface of the first substrate;

a second substrate provided on a front surface of the display layer, the second substrate comprising an upper end, a left end, and a right end coincident with the upper end, the left end, and the right end of the first substrate, and further comprising a lower end shorter than the lower end of the first substrate, wherein the second substrate is configured relative to the first substrate to expose the plurality of wiring pads of the first substrate;

a plurality of side wiring pads provided on the lower end of the first substrate and the lower end of the second substrate, wherein each respective side wiring pad is connected to a respective a wiring pad of the plurality of wiring pads; and a display driving circuit connected to the plurality of side wiring pads, wherein the plurality of side wiring pads are bent to correspond to a step formed by the lower end of the first substrate and the lower end of the second substrate, and wherein each wiring pad of the plurality of wiring pads is in contact with at least one side wiring pad of the plurality of side wiring pads.

2. The display apparatus of claim 1, further comprising an anisotropic conductive film (ACF) disposed between the plurality of side wiring pads and the display driving circuit.

3. The display apparatus of claim 1,
wherein each wiring pad of the plurality of wiring pads comprises an upper surface and an end, and
wherein the upper surface and the end of each wiring pad of the plurality of wiring pads is in contact with at least one side wiring pad of the plurality of side wiring pads.

4. The display apparatus of claim 1, wherein each side wiring pad of the plurality of side wiring pads comprises silver paste, and
wherein the plurality of side wiring pads are formed by thermally transferring the plurality of side wiring pads from a plastic film to the lower end of the first substrate and the lower end of the second substrate.

5. The display apparatus of claim 4, wherein
the plastic film comprises polyethylene terephthalate (PET).

6. The display apparatus of claim 1, wherein
the display driving circuit comprises a plurality of 3-chip on films, and
wherein each 3-chip on film of the plurality of 3-chip on films comprise a gate integrated circuit and a plurality of source integrated circuits.

7. The display apparatus of claim 6, wherein
the display driving circuit further comprises a flexible printed circuit board connected to the plurality of 3-chip on films.

8. The display apparatus of claim 1, wherein
the display layer comprises a liquid crystal layer,
wherein the first substrate further comprises a plurality of thin film transistors configured to operate the liquid crystal layer, and
wherein the second substrate further comprises a plurality of color filters.

9. The display apparatus of claim 8,
wherein each thin film transistor of the plurality of thin film transistors comprises a gate electrode and a source electrode, and wherein the gate electrode and the source electrode of each thin film transistor of the plurality of thin film transistors is connected to a wiring pad of the plurality of wiring pads.

10. The display apparatus of claim 1, further comprising:
a bezel formed to cover an edge of the second substrate,
wherein the bezel comprises a lower bezel configured to cover the plurality of side wiring pads and the display driving circuit, and
wherein a width of the lower bezel is 1 mm or less.

11. A method of manufacturing a display apparatus, the method comprising:
forming a display panel comprising a first substrate, a display layer, and a second substrate;
preparing a side wiring pad film comprising a sheet of film and a plurality of side wiring pads formed on a surface of the sheet of film;
transferring the plurality of side wiring pads of the side wiring pad film to an edge of the display panel;
curing the plurality of side wiring pads transferred to the edge of the display panel; and
disposing a display driving circuit on the plurality of side wiring pads at the edge of the display panel,
wherein the transferring the plurality of side wiring pads further comprises:
positioning the side wiring pad film on the edge of the display panel so that the plurality of side wiring pads contact the edge of the display panel;
bending upper and lower portions of the side wiring pad film to conform to a shape of the edge of the display panel;
transferring the plurality of side wiring pads to the edge of the display panel by applying heat to the side wiring a film; and
removing the sheet of film from the plurality of side wiring pads.

12. The method of claim 11,
wherein the sheet of film comprises a plastic film, and
wherein the preparing a side wiring pad film further comprises:
applying a conductive paste to one surface of the plastic film; and
forming the plurality of side wiring pads on the plastic film from the conductive paste by patterning the conductive paste through a photolithography process.

13. The method of claim 11,
wherein the sheet of film comprises a plastic film.

14. The method of claim 11,
wherein the edge of the display panel comprises an edge of the first substrate and an edge of the second substrate,
wherein the forming the display panel further comprises disposing a plurality of wiring pads between the first substrate and the display layer,
wherein the plurality of wiring pads are configured to extend to the edge of the first substrate and each wiring pad of the plurality of wiring pads comprises an upper surface,
wherein the edge of the first substrate is configured to extend beyond the edge of the second substrate and the plurality of wiring pads of the first substrate are exposed to an outside, and
wherein the bending upper and lower portions of the side wiring pad film to conform to the shape of the edge of the display panel further comprises:
bending the side wiring pad film so that each respective side wiring pad of the plurality of side wiring pads of the side wiring pad film contacts the upper surface of a wiring pad of the plurality of wiring pads.

15. The method of claim 11, wherein
the disposing a display driving circuit on the plurality of side wiring pads at the edge the display panel comprises:
attaching an anisotropic conductive film to the plurality of side wiring pads; and
attaching the display driving circuit to an outer surface of the anisotropic conductive film.

16. A display apparatus comprising:
a first substrate comprising a plurality of wiring pads and an edge, wherein each wiring pad of the plurality of wiring pads is disposed on a first surface of the first substrate and is configured to extend to the edge of the first substrate;
a display layer provided on the first surface of the first substrate;
a second substrate comprising an edge, wherein the second substrate is provided on a surface of the display layer opposite from the first substrate, and wherein the plurality of wiring pads of the first substrate are exposed to an outside;
a plurality of side wiring pads provided on the edge of the first substrate and the edge of the second substrate, wherein each respective side wiring pad is connected to a respective wiring pad of the plurality of wiring pads; and
a display driving circuit connected to the plurality of side wiring pads,
wherein the plurality of side wiring pads are bent to correspond to a step formed by the edge of the first substrate and the edge of the second substrate, and
wherein each wiring pad of the plurality of wiring pads is in contact with at least one side wiring pad of the plurality of wiring pads.

17. The display apparatus of claim 16, further comprising an anisotropic conductive film (ACF) disposed between the plurality of side wiring pads and the display driving circuit.

18. The display apparatus of claim 16,
wherein each wiring pad of the plurality of wiring pads comprises an upper surface and an end, and
wherein the upper surface and end of each wiring pad of the plurality of wiring pads are in contact with at least one side wiring pad of the plurality of side wiring pads.

19. The display apparatus of claim 16, wherein the plurality of side wiring pads comprise silver paste, and
wherein the plurality of side wiring pads are formed by thermally transferring the plurality of side wiring pads from a plastic film to the edge of the first substrate and the edge of the second substrate.

20. The display apparatus of claim 16, wherein
the display driving circuit comprises a plurality of 3-chip on films, and
wherein each 3-chip on film of the plurality of 3-chip on films comprise a gate integrated circuit and a plurality of source integrated circuits.

* * * * *